(12) United States Patent
Chan et al.

(10) Patent No.: US 8,953,384 B2
(45) Date of Patent: Feb. 10, 2015

(54) SENSE AMPLIFIER FOR FLASH MEMORY

(75) Inventors: Johnny Chan, Fremont, CA (US);
Koying Huang, San Jose, CA (US)

(73) Assignee: Winbond Electronics Corporation, Taichung (TW)

( * ) Notice: Subject to any disclaimer, the term of this patent is extended or adjusted under 35 U.S.C. 154(b) by 220 days.

(21) Appl. No.: 13/563,337

(22) Filed: Jul. 31, 2012

(65) Prior Publication Data

US 2014/0036596 A1 Feb. 6, 2014

(51) Int. Cl.
*G11C 11/34* (2006.01)
*G11C 7/02* (2006.01)
*G11C 7/00* (2006.01)
*G11C 16/28* (2006.01)
*G11C 11/56* (2006.01)

(52) U.S. Cl.
CPC ............ *G11C 16/28* (2013.01); *G11C 11/5642* (2013.01)
USPC .................. 365/185.21; 365/185.2; 365/207; 365/209; 365/205

(58) Field of Classification Search
CPC .......... G11C 7/12; G11C 16/26; G11C 16/28; G11C 11/4091; G11C 8/08; G11C 11/5642; G11C 7/062; G11C 13/004
USPC .................. 365/185.21, 189.07, 207, 189.09, 365/189.11, 205, 209
See application file for complete search history.

(56) References Cited

U.S. PATENT DOCUMENTS

| | | | |
|---|---|---|---|
| 5,862,077 A | 1/1999 | Briner | |
| 6,134,165 A * | 10/2000 | Spence | 365/205 |
| 6,366,497 B1 * | 4/2002 | Guliani et al. | 365/185.21 |
| 6,400,606 B1 * | 6/2002 | Cho | 365/185.2 |
| 6,707,717 B2 | 3/2004 | Jun-Lin | |
| 6,775,184 B1 | 8/2004 | Park et al. | |
| 6,795,344 B2 | 9/2004 | Lin | |
| 6,813,206 B2 | 11/2004 | Chang | |
| 7,184,348 B2 * | 2/2007 | Crippa et al. | 365/207 |
| 7,203,107 B2 | 4/2007 | Yeh | |
| 7,251,178 B2 * | 7/2007 | Gogl et al. | 365/209 |
| 7,319,617 B2 | 1/2008 | Park | |
| 7,333,378 B2 | 2/2008 | Sim | |
| 7,835,187 B2 | 11/2010 | Tamada et al. | |
| 2003/0002342 A1 * | 1/2003 | Srinivasan et al. | 365/185.21 |
| 2004/0052146 A1 | 3/2004 | Sim | |

* cited by examiner

*Primary Examiner* — J. H. Hur
*Assistant Examiner* — Ajay Ojha
(74) *Attorney, Agent, or Firm* — David H. Carroll

(57) ABSTRACT

A sense amplifier has a reference cell current branch in which a reference cell determines a reference cell current, a column load converts the reference cell current to a reference voltage, and a feedback circuit to maintain the reference cell drain voltage. The sense amplifier also has a main cell current branch in which a main cell operationally selected from an array of flash memory cells determines a main cell current, a column load converts the main cell current to a main voltage, and a feedback circuit to maintain the main cell drain voltage. A differential amplifier compares the reference voltage with the main voltage and furnishes a logical level at its output depending on the relative values. A boost circuit has a pull up section coupled across the column load and a pull down section coupled across the main cell for accelerating the logical zero sensing time.

6 Claims, 7 Drawing Sheets

SENSE AMPLIFIER FOR FLASH MEMORY

BACKGROUND OF THE INVENTION

1. Field of the Invention

The present invention relates to flash memory, and more particularly to sense amplifiers for flash memory.

2. Description of Related Art

FIG. 1 is a high-level functional block diagram of a conventional sense amplifier 10 suitable for nonvolatile memory technologies such as flash memory. The sense amplifier 10 has two branches, a reference cell current branch 20 and a main cell current branch 40. In the reference cell current branch 20, a reference cell 26 determines a reference cell current, a column load 22 converts the reference cell current to a voltage $V_{RC}$, and a drain bias 24 maintains the drain voltage for the reference cell 26 at an appropriate level. In the main cell current branch 40, a main cell 46 operationally selected from an array of flash memory cells determines a main cell current based on the data stored therein, a column load 42 converts the main cell current to a voltage $V_{MC}$, and a drain bias 44 maintains the drain voltage for the selected memory cell at an appropriate level. A differential amplifier 30 compares the reference cell voltage $V_{RC}$ with the main cell voltage $V_{MC}$ and furnishes a logical level at its output depending on the relative values of $V_{RC}$ and $V_{MC}$.

Many different circuits and devices may be used for the column loads 22 and 42, for the drain bias 24 and 44, for the reference cell 26, for the array of main cells 46, and for the differential amplifier 30. FIGS. 2 and 3 show two different implementations.

FIG. 2 is a schematic diagram of a conventional sense amplifier 110 which is based on the approach shown in FIG. 1. The sense amplifier 110 has two branches, a reference cell current branch 120 and a main cell current branch 140. In the reference cell current branch 120, a reference cell 129 determines the reference cell current, and a MOSFET load 125 converts the reference cell current to a voltage RIN. A drain bias circuit, which maintains the drain voltage for the reference cell 129 at an appropriate level, is formed by MOSFET's 122, 123 and 126. Additional MOSFET's in the reference cell current branch 120 include a reference YB select transistor 127, a reference YA select transistor 128, and the reference cell 129 whose gate is connected to a reference wordline. In the main cell current branch 140, a main cell 149 selected from the flash memory array determines the main cell current, and a MOSFET load 145 converts the main cell current to a voltage SIN. A drain bias circuit, which maintains the drain voltage for the main cell 149 at an appropriate level, is formed by MOSFET's 142, 143 and 146. Additional MOSFET's in the main cell current branch 140 include a YB select transistor 147, a YA select transistor 148, and the main cell 149 whose gate is connected to a memory array wordline. A differential amplifier 130 compares the reference cell voltage RIN with the main cell voltage SIN and furnishes a logical level at its DATA output depending on the relative values of RIN and SIN.

The sense amplifier 110 operates as follows. The reference cell current in the reference cell current branch 120 is established by the reference YB select transistor 127, the reference YA select transistor 128, and in particular the reference cell 129. The voltage RIN is established by flow of the reference cell current through the MOSFET load 125. A predetermined drain voltage is established at the drain of the reference cell 129.

The main cell current in the main cell current branch 140 is established by the YB select transistor 147, the YA select transistor 148, and in particular the main cell 149 selected from an array of flash memory cells. If the main cell 149 has no charge on its gate, which corresponds to a logical one, the main cell 149 conducts heavily and the main cell current is large. The voltage SIN tends to go low due to a high voltage drop across the MOSFET load 145, but the voltage drop across the transistor 146 is appropriately low for establishing the predetermined drain voltage at the drain of the main cell 149. On the other hand, if the main cell 149 has a negative charge on its gate, which corresponds to a logical zero, the main cell 149 conducts weakly if at all and the main cell current becomes small or zero. The voltage SIN tends to go high due to a small voltage drop across the MOSFET load 145, but the voltage drop across the transistor 146 is appropriately high for establishing the predetermined drain voltage at the drain of the main cell 149.

The voltages RIN and SIN are applied to the positive and negative inputs respectively of the differential amplifier 130. The output DIGITAL DATA of the differential amplifier 130 represents either a logical zero or logical one depending on the relative values of RIN and SIN.

FIG. 3 is a schematic diagram of another conventional sense amplifier 210 which is also based on the approach shown in FIG. 1. The sense amplifier 210 has two branches, a reference cell current branch 220 and a main cell current branch 240. In the reference cell current branch 220, a reference cell 228 determines the reference cell current, and a resistive load 221 converts the reference cell current to a voltage RIN. A drain bias circuit, which maintains the drain voltage for the reference cell 228 at an appropriate level, is formed by MOSFET's 222, 224 and 225. MOSFET 223 is a quick charge transistor for the bit line. Additional MOSFET's in the reference cell current branch 220 include a mini-array W-select transistor 226, a mini-array Y-select transistor 227, and the reference cell 228 whose gate is connected to a mini-array wordline. In the main cell current branch 240, a main cell 248 selected from a flash memory array determines the main cell current, and a resistive load 241 converts the main cell current to a voltage SIN. A drain bias circuit, which maintains the drain voltage for the main cell 248 at an appropriate level, is formed by MOSFET's 242, 244 and 245. MOSFET 243 is a quick charge transistor for the bit line. Additional MOSFET's in the main cell current branch 240 include a W-select transistor 246, a Y-select transistor 247, and a selected main cell 248 whose gate is connected to an array wordline. A differential amplifier 230 compares the reference cell voltage RIN with the main cell voltage SIN and furnishes a logical level at its DIGITAL DATA output depending on the relative values of RIN and SIN.

FIG. 4 is a graph of illustrative drain current $I_D$ versus gate voltage $V_{GATE}$ in the sense amplifier 210, for an erased main cell, for a reference cell, and for a programmed main cell. For a read gate voltage of 5 volts, the drain current Id is zero for a programmed cell and somewhat in excess of 100 µA for an erased cell. Since the drain current Id is 50 µA for the reference cell, the sense amplifier 210 can readily distinguish the over 100 µA current attributable to an erased cell from the zero current attributable to a programmed cell. These values are illustrative, since actual values depend on the specific implementation and component values selected.

BRIEF SUMMARY OF THE INVENTION

One embodiment of the present invention is a sense amplifier for sensing data stored in a selected memory cell of a flash memory array, comprising a differential amplifier; a reference cell current branch comprising a reference cell, a first drain bias section coupled to the reference cell, and a first load section coupled to the first drain bias section and to a first input of the differential amplifier; a main cell current branch comprising a selected memory cell, a second drain bias section coupled to the selected memory cell, and a second load section coupled to the second drain bias section and to a second input of the differential amplifier; and a boost circuit comprising a pull-up section coupled to the second input of the differential amplifier and a pull-down section coupled to the selected memory cell.

Another embodiment of the present invention is a method of operating a sense amplifier for reading data stored in a selected memory cell of a flash memory array, comprising: activating a reference cell current branch comprising a reference cell, a first drain bias section coupled to the reference cell, and a first load section coupled to the first drain bias section and to a first input of the differential amplifier, wherein a reference voltage is established across the first load section; activating a main cell current branch comprising a selected memory cell, a second drain bias section coupled to the selected memory cell, and a second load section coupled to the second drain bias section and to a second input of the differential amplifier, wherein a sense voltage dependent on the data stored in the selected memory cell is established across the second load section; activating a boost circuit comprising a pull-up section coupled to the second input of the differential amplifier and a pull-down section coupled to the selected memory cell; applying the reference voltage to a first input of a differential amplifier, and the sense voltage to a second input of the differential amplifier; and providing a digital output level from the differential amplifier in accordance with a difference between the reference voltage on the first input of the differential amplifier, and the sense voltage on the first input of the differential amplifier.

Another embodiment of the present invention is a sense amplifier for sensing data stored in a selected memory cell of a flash memory array, comprising: a differential amplifier; a VCC voltage node; a VSS voltage node; a reference cell current branch activation signal node; a first cell select NMOS transistor; a second cell select NMOS transistor; a reference cell floating gate MOSFET transistor; a first PMOS transistor switch having a source coupled to the VCC voltage node, a gate coupled to the reference cell current branch activation signal node, and a drain; a first NMOS transistor load having a drain coupled to the drain of the first PMOS switching transistor, a source coupled to a plus input of the differential amplifier, and a gate coupled to the VCC voltage node; a first NMOS transistor variable conductor having a drain coupled to the source of the first NMOS transistor load, a source coupled to the reference cell floating gate MOSFET transistor through the first and second cell select NMOS transistors, and a gate; a first NMOS transistor feedback element having a drain coupled to the gate of the first NMOS transistor variable conductor, a source coupled to the VSS voltage node, and a gate coupled to the source of the first NMOS transistor variable conductor; a second PMOS transistor switch having a source coupled to the VCC voltage node, a gate coupled to the reference cell activation signal node, and a drain; a first PMOS transistor load having a source coupled to the drain of the first PMOS switching transistor, a drain coupled to the drain of the first NMOS transistor feedback element, and a gate coupled to the drain of the first PMOS transistor load; a main cell current branch activation signal node; a third cell select NMOS transistor; a fourth cell select NMOS transistor; a main cell floating gate MOSFET transistor selected from an array of floating gate MOSFET transistors by the third and fourth cell select NMOS transistors; a third PMOS transistor switch having a source coupled to the VCC voltage node, a gate coupled to the main cell current branch activation signal node, and a drain; a second NMOS transistor load having a drain coupled to the drain of the second PMOS switching transistor, a source coupled to a minus input of the differential amplifier, and a gate coupled to the VCC voltage node; a second NMOS transistor variable conductor having a drain coupled to the source of the second NMOS transistor load, a source coupled to the main cell floating gate MOSFET transistor through the third and fourth cell select NMOS transistors, and a gate; a second NMOS transistor feedback element having a drain coupled to the gate of the second NMOS transistor variable conductor, a source coupled to the VSS voltage node, and a gate coupled to the source of the second NMOS transistor variable conductor; a fourth PMOS transistor switch having a source coupled to the VCC voltage node, a gate coupled to the main cell current branch activation signal node, and a drain; a second PMOS transistor load having a source coupled to the drain of the second PMOS switching transistor, a drain coupled to the drain of the second NMOS transistor feedback element, and a gate coupled to the drain of the second PMOS transistor load; a boost circuit activation signal node; a fifth PMOS transistor switch having a source coupled to the VCC voltage node, a gate coupled to the boost circuit activation signal node, and a drain; a NMOS pull up transistor having a drain coupled to the drain of the fifth PMOS transistor switch, a source coupled to the source of the second NMOS transistor load, and a gate coupled to the VCC voltage node; a boost circuit bias voltage node; and a NMOS pull down transistor having a source coupled to the VSS voltage node, a drain coupled to the source of the second NMOS transistor load, and a gate coupled to the boost circuit bias voltage node.

DETAILED DESCRIPTION OF THE INVENTION, INCLUDING THE BEST MODE

Figure 1:
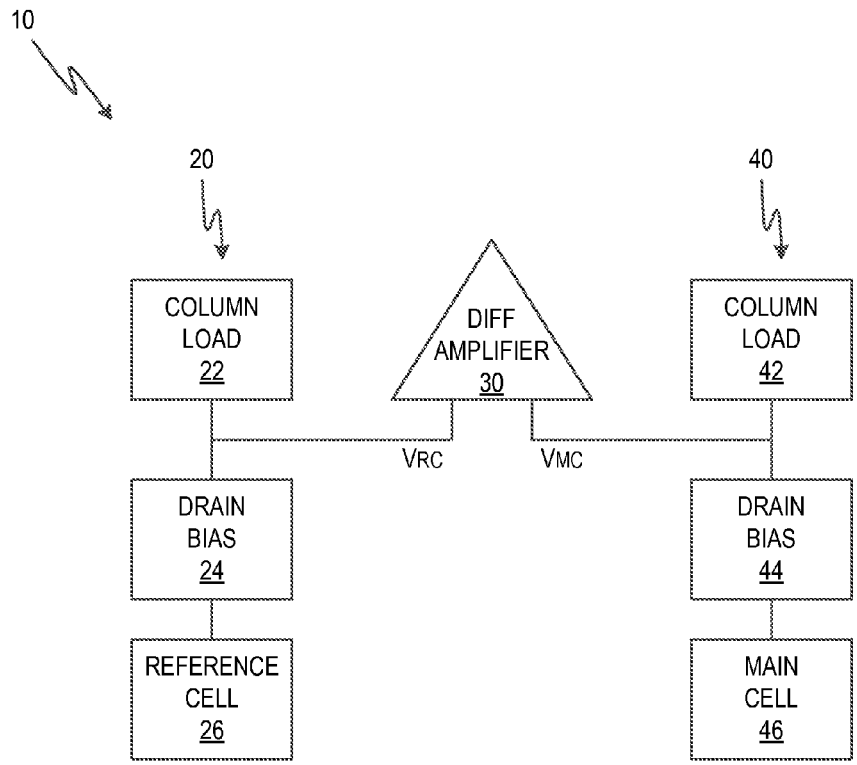
FIG. 1 is a functional block diagram of a sense amplifier for a flash memory.
Figure 4:
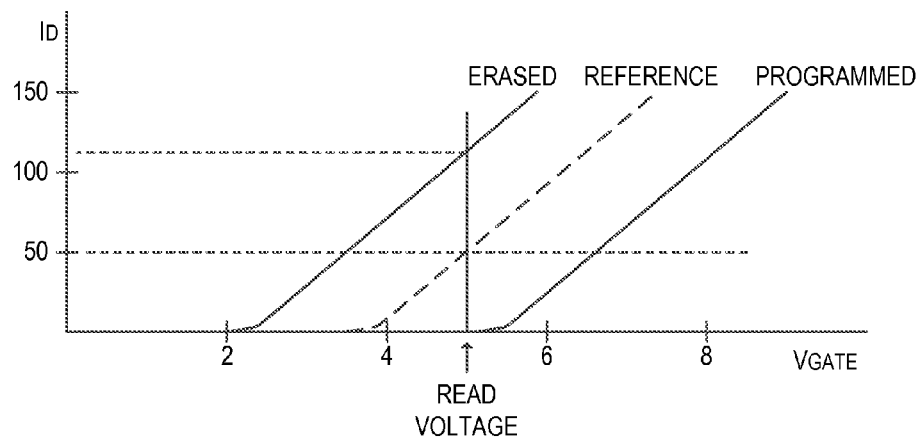
FIG. 4 is a graph useful for explaining the operation of the sense amplifier of FIG. 3.
Figure 2:
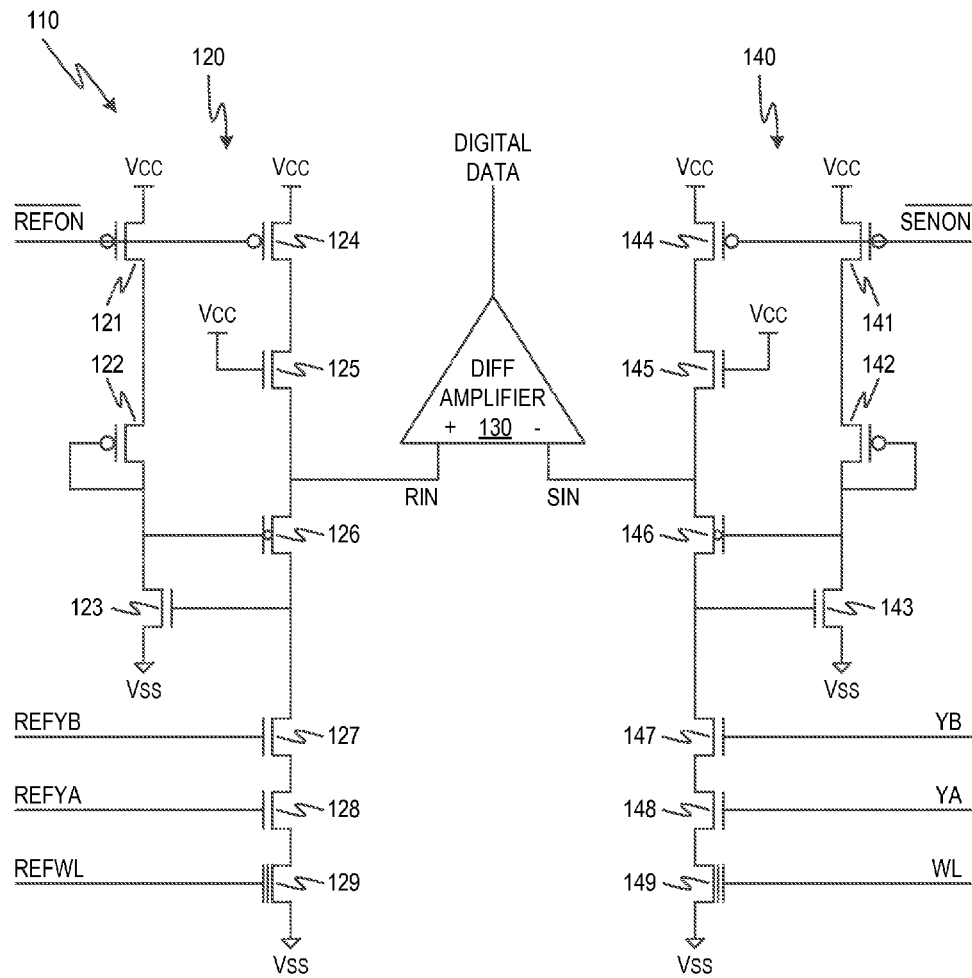
FIG. 2 is a schematic circuit diagram of one implementation of the sense amplifier of FIG. 1.
Figure 3:
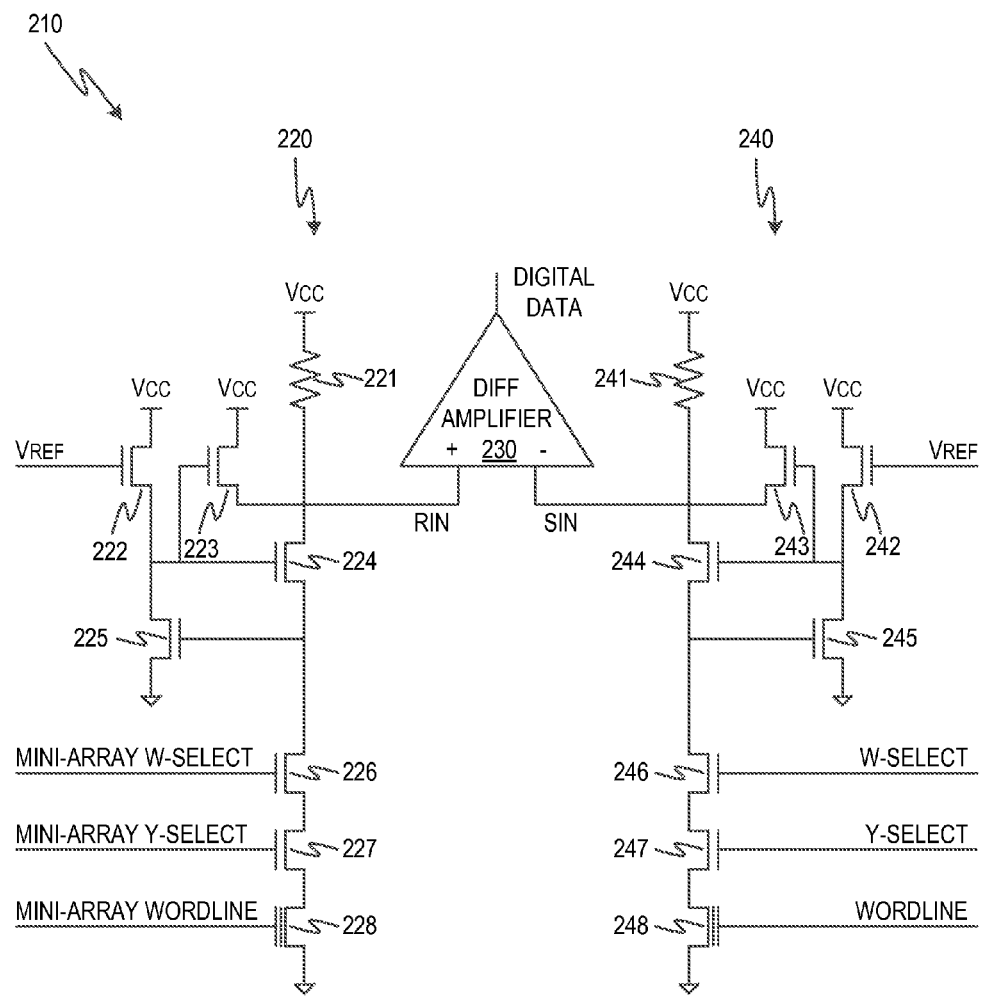
FIG. 3 is a schematic circuit diagram of another implementation of the sense amplifier of FIG. 1.
Figure 5:
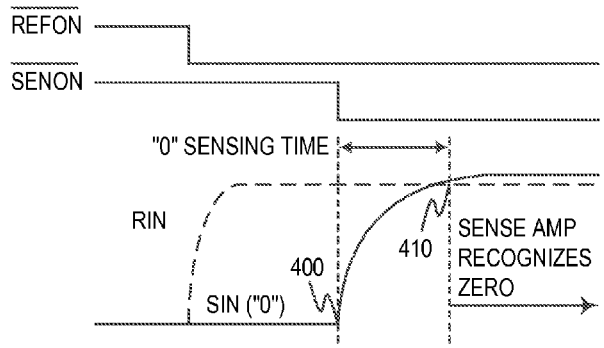
FIG. 5 is a graph useful for explaining the sensing time of the sense amplifier of FIG. 2.

High memory speed is desirable. In the conventional sense amplifiers 110 shown in FIG. 2, for example, if the main cell 149 has a negative charge on its gate, which corresponds to a logical zero, the main cell conducts weakly and the main cell current is small. The speed of the sense amplifier 210 is limited by the time needed to charge the global bitline capacitance and then sense the "0" value stored in the main cell. FIG. 5 shows the sensing time for a logical zero, which begins after the reference voltage SAINR stabilizes and when the sense amplifier is enabled by a sense amplifier enable signal SENON/. The sensing time is the time required for the voltage SAIN to rise from zero at point 400 to a crossing 410 with the reference voltage SAINR.

Figure 6:
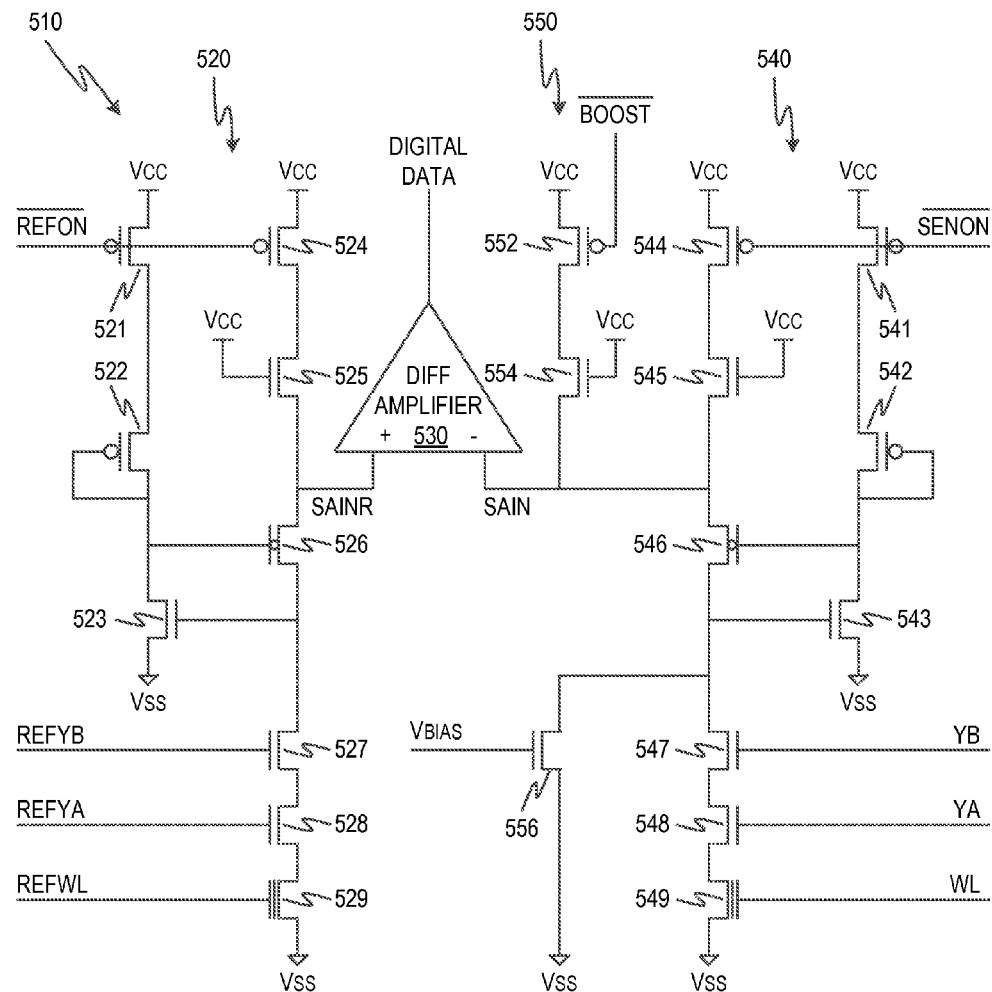
FIG. 6 is a schematic circuit diagram of an illustrative implementation of a sense amplifier having a boost circuit.

FIG. 6 is a schematic diagram of a sense amplifier 510 which achieves a faster sensing time. The sense amplifier 510 has two branches, a reference cell current branch 520 and a main cell current branch 540, which furnish respective voltages SAINR and SAIN to respectively the positive and negative inputs of a differential amplifier 530. In the reference cell current branch 520, a reference cell 529 determines the reference cell current, and a load element, illustratively a n-channel MOSFET ("NMOS") 525 operating in saturation, converts the reference cell current to a reference voltage SAINR. The gate of NMOS 525 is connected to $V_{CC}$, and the source is connected to the positive input of the differential amplifier 530. A drain bias circuit, which maintains the drain voltage for the reference cell 529 at an appropriate level, is formed by MOSFET's 522, 523 and 526. The NMOS 526, which illustratively is a native or low $V_T$ NMOS, has a drain connected to the source of the NMOS 525, and a source connected to a series circuit formed by a reference YB NMOS transistor 527, a reference YA NMOS transistor 528, and the reference cell 529 whose gate is connected to a reference wordline. NMOS 523 has a gate connected to the source of NMOS 526, a source connected to $V_{SS}$, and a drain connected to the gate of NMOS 526. The PMOS 522 has a drain connected to the drain of NMOS 523, and a gate connected to its drain. PMOS 521 and PMOS 524 are switching transistors which control the on/off status of the reference cell branch 520. To this end, the PMOS 521 has a source connected to $V_{CC}$, a drain connected to the source of PMOS 522, and a gate connected to control line REFON/, and the PMOS 524 has a source connected to $V_{CC}$, a drain connected to the drain of NMOS 525, and a gate connected to control line REFON/. In the main cell current branch 540, a main cell 549 selected from an array of flash memory cells by YB select NMOS 547 and YA NMOS 548, determines the main cell current, and a load element, illustratively NMOS 545 operating in saturation, converts the main cell current to a main voltage SAIN. The gate of NMOS 545 is connected to $V_{CC}$, and the source is connected to the negative input of the differential amplifier 530. A drain bias circuit, which maintains the drain voltage for the main cell 549 at an appropriate level, is formed by MOSFET's 542, 543 and 546. Native NMOS 546 has a drain connected to the source of the NMOS 545, a source connected to a series circuit formed by the YB select NMOS 547, the YA select NMOS 548, and the main cell 549 whose gate is connected to a wordline WL. NMOS 543 has a gate connected to the source of NMOS 546, a source connected to $V_{SS}$, and a drain connected to the gate of NMOS 546. The PMOS 542 has a drain connected to the drain of NMOS 543, and a gate connected to its drain. PMOS 541 and PMOS 544 are switching transistors which control the on/off status of the main cell branch 540. To this end, the PMOS 541 has a source connected to $V_{CC}$, a drain connected to the source of PMOS 542, and a gate connected to control line SENON/, and the PMOS 544 has a source connected to $V_{CC}$, a drain connected to the drain of NMOS 545, and a gate connected to control line SENON/.

FIG. 6 also shows a boost circuit 550 which improves the sensing speed of the sense amplifier 510. The boost circuit 550 includes a pull-up section which illustratively uses PMOS 552 to control the pull up timing, and NMOS 554 operating in saturation to provide a charging current for bit line sensing. The PMOS 552 has a gate connected to signal line BOOST/, a source connected to $V_{CC}$, and a drain connected to the drain of NMOS 554. The NMOS 554 has a gate which is connected to $V_{CC}$ and a source which is connected to the source of NMOS 545, which is the load device for the main cell current branch 540. The PMOS 552 and the NMOS 554 are sized so that the pull up strength is, illustratively, twice the pull up strength of the column load NMOS 545. The boost circuit 550 also includes a pull-down section which illustratively uses NMOS 556, which has a gate connected to $V_{BIAS}$, a source connected to $V_{SS}$, and a drain connected to the bit line to the main cell 549 through the select transistors NMOS 547 and NMOS 548. The NMOS 556 is sized so that the pull down strength is, illustratively, twice the pull down strength of the main cell 549 when storing no charge (logical one). The voltage $V_{BIAS}$ controls the NMOS 556 to generate twice the ON cell current to negate the additional two-times pull up in the DC level from the pull-up section.

Figure 7:
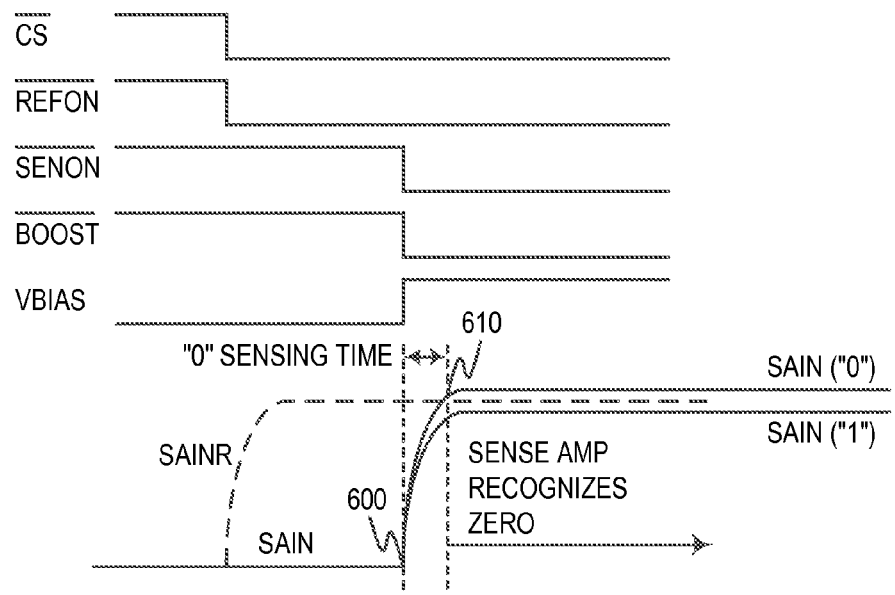
FIG. 7 is a graph useful for explaining the sensing time of the sense amplifier of FIG. 6.

The effect of the boost circuit 550 is shown in FIG. 7, which shows the sensing time for a logical zero, namely SAIN ("0"). SAIN ("1") is also shown for completeness, but since it never crosses SAINR, there is no speed concern for sensing a logical 1. The sensing operation begins by enabling the reference cell current branch 520 by asserting REFON/, and after the reference voltage SAINR stabilizes, then enabling the main cell current branch 540 by asserting SENON/. The sensing time is the time required for the voltage SAIN to rise from zero at point 600 to a crossing 610 with the reference voltage SAINR.

The sense amplifier 510 with the boost circuit 550 operates as follows. The signal REFON/ establishes the reference cell current in the reference cell current branch 520, based on the reference YB transistor NMOS 527, the reference YA transistor NMOS 528, and in particular the reference cell 529. In particular, when REFON/ goes low, it turns on PMOS 521 to activate the drain bias circuit, and also turns on PMOS 524 to establish the reference cell current through the NMOS 525. The voltage drop across the NMOS 525 establishes the voltage SAINR, which is applied to the differential amplifier 530. A predetermined drain bias for the reference cell 529 is maintained within a predetermined tolerance by PMOS 522, NMOS 523, and native NMOS 526 arranged in a feedback circuit in the following manner. The bias voltage at the source of native NMOS 526 is applied to the gate of NMOS 523. If the bias voltage tends to increase, NMOS 523 tends to conduct more strongly which reduces the voltage applied to the gate of NMOS 526. NMOS 526 in turn conducts more weakly, which tends to restore the bias voltage to the predetermined level. If the bias voltage tends to decrease, NMOS 523 tends to conduct more weakly which increases the voltage applied to the gate of NMOS 526. NMOS 526 in turn conducts more strongly, which tends to restore the bias voltage to the predetermined level.

After the reference cell current branch 520 is activated, the signal SENON/ establishes the main cell current in the main cell current branch 540, based on the YB select transistor NMOS 547, the YA select transistor NMOS 548, and in particular the main cell 549. In particular, when SENON/ goes low, it turns on PMOS 541 to activate the drain bias circuit, and also turns on PMOS 544 to establish the main cell current through the NMOS 545. The voltage drop across the NMOS 545 establishes the voltage SAIN, which is applied to the differential amplifier 530. Additionally, the signal BOOST/ is asserted (goes low) and turns on PMOS 552 to activate the pull-up section of the boost circuit 550. Additionally, the voltage $V_{BIAS}$ is applied to NMOS 556 to activate the pull-down section of the boost circuit 550. The main cell current branch 540 and the pull-up and pull-down sections of the boost circuit 550 may be activated concurrently or at different times as desired, to achieve the desired results of speeding up sensing and avoiding any sensing overshoot effect. A predetermined drain bias for the main cell 549 is maintained within a predetermined tolerance by PMOS 542, NMOS 543, and native NMOS 546 arranged in a feedback circuit in the following manner, regardless of the stored charge state of the main cell 549. The bias voltage at the source of native NMOS 546 is applied to the gate of NMOS 543. If the bias voltage tends to increase, NMOS 543 tends to conduct more strongly which reduces the voltage applied to the gate of NMOS 546. NMOS 546 in turn conducts more weakly, which tends to restore the bias voltage to the predetermined level. If the bias voltage tends to decrease, NMOS 543 tends to conduct more weakly which increases the voltage applied to the gate of NMOS 546. NMOS 546 in turn conducts more strongly, which tends to restore the bias voltage to the predetermined level.

The voltages SAINR and SAIN are applied to the positive and negative inputs respectively of the differential amplifier 530 respectively. The voltage SAINR is equal to $V_{CC}$ minus the voltage drops across PMOS 524 and especially across NMOS 525, while the voltage SAIN is equal to $V_{CC}$ minus the voltage drops across PMOS 544 and especially across NMOS 545. The output DIGITAL DATA of the differential amplifier represents either a logical zero or logical one depending on the relative values of SAINR and SAIN.

Figure 8:
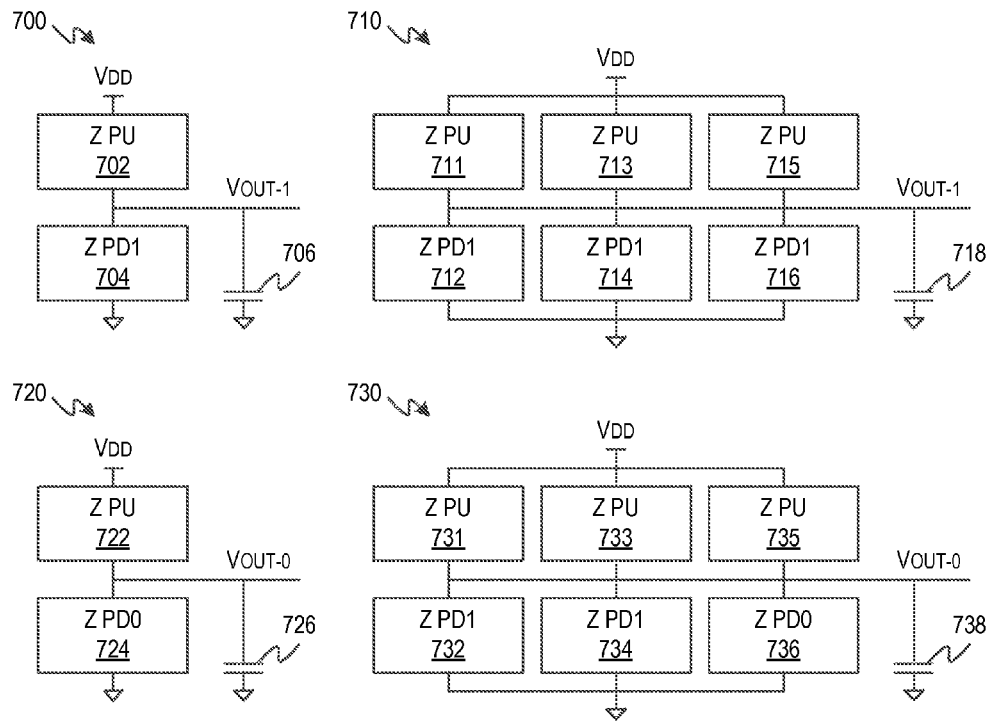
FIG. 8 is a functional block diagram useful for explaining the faster sensing time achieved by the sense amplifier of FIG. 6.

FIG. 8 shows how the boost circuit 550 (FIG. 6) operates on the principle of a voltage divider to speed up the sensing operation. The notation "Z PU" represents the pull up impedance of a load in the main cell current branch, and also represents the pull-up impedance of NMOS 554 in the pull-up section of the boost circuit 550. The notation "Z PD0" represents the pull-down impedance of the memory device in the main cell current branch when storing a negative charge on its floating gate (represents a logical zero). The notation "Z PD1" represents the pull-down impedance of the memory device in the main cell current branch with no charge on its floating gate (represents a logical one). The notation "Z PD1" also represents the pull-down impedance of NMOS 556 in the pull-down section of the boost circuit 550. Capacitors 706, 718, 726 and 738 represent bit line capacitance.

Illustration 700 represents the main cell current branch 140 of the sense amplifier 110 (FIG. 2) when the memory cell 149 has no charge on its floating gate (logical one). The pull-up impedance 702 represents the NMOS 145, while the pull-down impedance one 704 represents the memory cell 149 with no charge on its floating gate (plus the small additional impedance of select NMOS transistors 147 and 148). $V_{OUT\text{-}1}$ is described by the equation:

$$V_{OUT\text{-}1}=V_{DD}*(Z\_PD1/(Z\_PU+Z\_PD1)) \quad (1)$$

and the impedance Z140 in the main cell current branch 140 is described by the equation:

$$Z140=Z\_PU+Z\_PD1 \quad (2)$$

Illustration 710 represents the main cell current branch 540 of the sense amplifier 510 (FIG. 6) when the memory cell 549 has no charge on its floating gate (logical one). The pull-up impedance 715 represents the NMOS 545, while the pull-down impedance one 716 represents the memory cell 549 with no charge on its floating gate (plus the small additional impedance of select NMOS transistors 547 and 548). The NMOS 554 in the pull-up section of the boost circuit 550 is represented by pull-up impedances 711 and 713, since its strength is twice the strength of the NMOS 545. The NMOS 556 in the pull-down section of the boost circuit 550 is represented by pull-down impedances 712 and 714, since its strength is twice the strength of the memory cell 549. $V_{OUT\text{-}1}$ is described by the equation:

$$V_{OUT\text{-}1}=V_{DD}*((Z\_PD1/3)/((Z\_PU/3)+ (Z\_PD1/3)))=V_{DD}*(Z\_PD1/(Z\_PU+Z\_PD1)) \quad (3)$$

and the impedance Z540 in the main cell current branch 540 is described by the equation:

$$Z540=(Z\_PU/3)+(Z\_PD1/3) \quad (4)$$

When sensing a logical one, therefore, $V_{OUT\text{-}1}$ is the same for the sense amplifier 110 as it is for the sense amplifier 510, compare equations 1 and 3, but the sense time is faster due to the lower impedance Z540 in the main cell current branch 540, compare equations 2 and 4. While a faster sense time for sensing a logical one does not determine the sense time for the sense amplifier, the same principle applies to the sensing of a logical zero.

Illustration 720 represents the main cell current branch 140 of the sense amplifier 110 (FIG. 2) when the memory cell 149 has a negative charge on its floating gate (logical zero). The pull-up impedance 722 represents the NMOS 145, while the pull-down impedance zero 724 represents the memory cell 149 with a negative charge on its floating gate (plus the small additional impedance of select NMOS transistors 147 and 148). $V_{OUT\text{-}1}$ is described by the equation:

$$V_{OUT\text{-}0}=V_{DD}*(Z\_PD0/(Z\_PU+Z\_PD0)) \quad (5)$$

and the impedance Z140 in the main cell current branch 140 is described by the equation:

$$Z140=Z\_PU+Z\_PD0 \quad (6)$$

Illustration 730 represents the main cell current branch 540 of the sense amplifier 510 (FIG. 6) when the memory cell 549 has a negative charge on its floating gate (logical zero). The pull-up impedance 735 represents the NMOS 545, while the pull-down impedance zero 736 represents the memory cell 549 with a negative charge on its floating gate (plus the small additional impedance of select NMOS transistors 547 and 548). The NMOS 554 in the pull-up section of the boost circuit 550 is represented by pull-up impedances 731 and 733, since its strength is twice the strength of the NMOS 545. The NMOS 556 in the pull-down section of the boost circuit 550 is represented by pull-down impedances 732 and 734, since its strength is twice the strength of the memory cell 549. However, the pull-down impedance of the NMOS 556 is less than twice the pull-down impedance of the memory cell 549. $V_{OUT\text{-}0}$ is described by the equation:

$$V_{OUT\text{-}0}=V_{DD}*(Z2/Z1+Z2) \quad (7)$$

where $$Z1=Z\_PU/3$$

and where $$Z2=(Z\_PD1*Z\_PD1*Z\_PD0)/((Z\_PD1*Z\_PD1)+ (Z\_PD1*Z\_PD0)+(Z\_PD1*Z\_PD0))$$

and the impedance Z540 in the main cell current branch 540 is described by the equation:

$$Z540=Z1+Z2 \quad (8)$$

When sensing a logical zero, therefore, $V_{OUT\text{-}0}$ for the sense amplifier 510 is slightly lower than the same voltage for the sense amplifier 110; compare equations 5 and 7. However, as SAIN still crosses over SAINR, sensing is still achieved, albeit with a lesser sense margin which may be accommodated by good circuit design. However, of significance is that the sense time is faster due to the lower impedance Z540 in the main cell current branch 540; compare equations 6 and 8. This faster sense time for sensing a logical zero determines the sense time for the sense amplifier.

Figure 9:
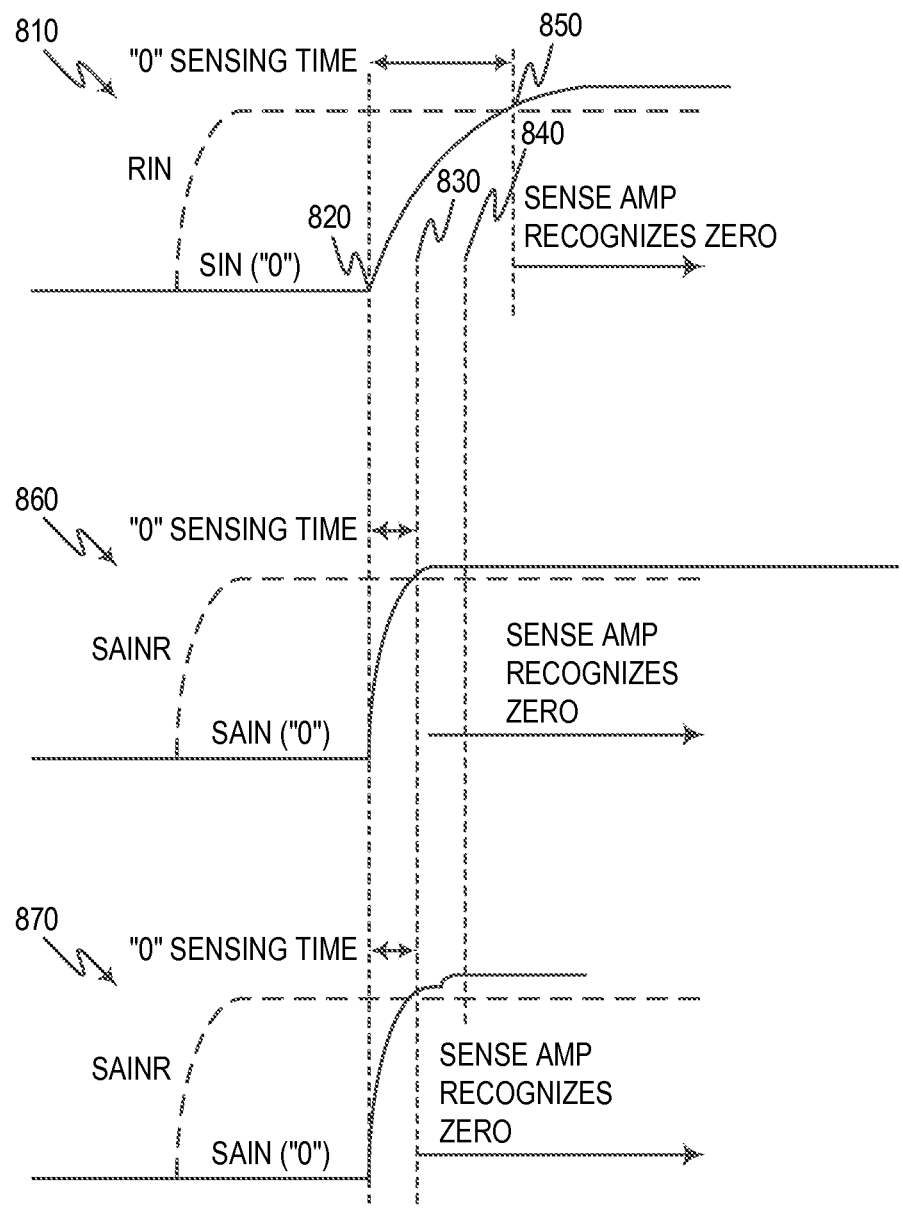
FIG. 9 is a set of graphs which illustrate the relative performance of various sense amplifier implementations.

The advantage of the boost circuit 550 may be seen in FIG. 9. Due to the relatively slow rise time of SIN, the zero sensing time shown in graph 810 is relatively long. The boost circuit 550 produces a faster rise time in SAIN as shown in graph 860; compare time marker 830 corresponding to the SAIN curve in graph 860 with time marker 850 corresponding to the SIN curve in graph 810.

The specific strengths described herein for a logical zero, namely 3× pull-up and 2× pull-down, are illustrative. Other strengths may be used as desired, consistent with achieving the desired improvement in the sensing time for a logical zero.

While the sense amplifier 510 shown in FIG. 6 uses timed signals BOOST/ and $V_{BIAS}$, other sources for the signals, including untimed sources, may be used if desired. The gate of PMOS 552 may be tied to ground to keep PMOS 552 enabled, and $V_{BIAS}$ may be applied continuously to NMOS 556. Similarly, REFON/ and SENON/ may be tied to ground to maintain the reference cell current branch 520 and the main cell current branch 540 enabled.

Figure 10:
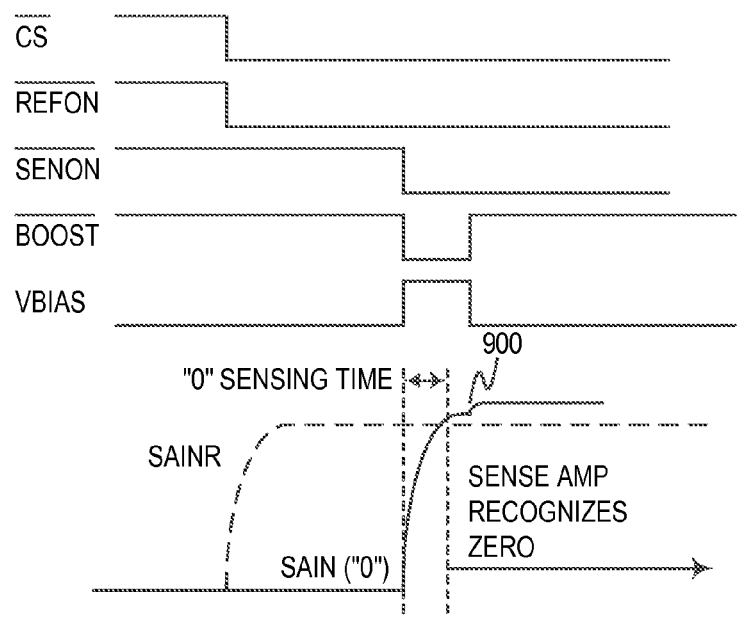
FIG. 10 is a graph useful for explaining sensing margin.

If a greater sensing margin is desired, the signal BOOST/ and $V_{BIAS}$ may be controlled to in effect remove the boost circuit 550 from the circuit after SAIN for a "0" stored value has crossed over with SAINR, to restore the original sensing margin. As shown in FIG. 10, BOOST/ and $V_{BIAS}$ are removed just after the "0" sensing, so that the boost circuit 550 is deactivated and SAIN rises from point 900 to restore the original sensing margin. As shown in FIG. 9, the same improvement in the "0" sensing time is achieved as with the BOOST/ signal and VBIAS shown in FIG. 7, but additionally the full sensing margin is restored at about time marker 840.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. While the circuits are specifically described with PMOS and NMOS transistors, the type of MOSFET (p-channel or n-channel) may be changed in some instances. Although a load in the form of an NMOS transistor is described, other types of loads may be used such as, for example, resistors, PMOS transistors, and current mirrors. The drain bias circuit may be varied as desired, and different types of reference cells, select transistors, and memory cells may be used. Moreover, specific values given herein are illustrative, and may be varied as desired. These and other variations and modifications of the embodiments disclosed herein, including of the alternatives and equivalents of the various elements of the embodiments, may be made without departing from the scope and spirit of the invention, including the invention as set forth in the following claims.

The invention claimed is:

1. A sense amplifier for sensing data stored in a selected memory cell of a flash memory array, comprising:
   a differential amplifier;
   a reference cell current branch comprising a reference cell, a first drain bias section coupled to the reference cell, and a first load section coupled to the first drain bias section and to a first input of the differential amplifier;
   a main cell current branch comprising the selected memory cell, a second drain bias section coupled to the selected memory cell, and a second load section coupled to the second drain bias section and to a second input of the differential amplifier;
   a boost circuit comprising a pull-up section coupled to the second input of the differential amplifier and a pull-down section coupled to the selected memory cell;
   a boost activation signal node; and
   a bias voltage node;
   wherein the pull up section of the boost circuit comprises a MOSFET pull-up transistor having a gate coupled to the boost activation signal node;
   the pull down section of the boost circuit comprises a MOSFET pull-down transistor having a gate coupled to the bias voltage node;
   the second load section comprises a MOSFET load transistor having a predetermined pull-up strength;
   the MOSFET pull-up transistor has a pull-up strength greater than the pull-up strength of the MOSFET load transistor; and
   the MOSFET pull-down transistor has a pull-down strength to substantially compensate for any change in the DC voltage level in the main cell current branch from the MOSFET pull-up transistor.

2. The sense amplifier of claim 1 wherein:
   the pull-up strength of the MOSFET pull-up transistor is twice the pull-up strength of the MOSFET load transistor; and
   the pull-down strength of the MOSFET pull-down transistor is twice the pull-down strength of a memory cell in a logical one state.

3. The sense amplifier of claim 1 further comprising:
   a boost activation signal node coupled to the pull-up section of the boost circuit; and
   a bias voltage node coupled to the pull-down section of the boost circuit.

4. A method of operating a sense amplifier for reading data stored in a selected memory cell of a flash memory array, comprising:
   activating a reference cell current branch comprising a reference cell, a first drain bias section coupled to the reference cell, and a first load section coupled to the first drain bias section and to a first input of the differential amplifier, wherein a reference voltage is established across the first load section;
   activating a main cell current branch comprising the selected memory cell, a second drain bias section coupled to the selected memory cell, and a second load section coupled to the second drain bias section and to a second input of the differential amplifier, wherein a sense voltage dependent on the data stored in the selected memory cell is established across the second load section;
   activating a boost circuit comprising a pull-up section coupled to the second input of the differential amplifier and a pull-down section coupled to the selected memory cell;
   applying the reference voltage to a first input of a differential amplifier, and the sense voltage to a second input of the differential amplifier; and
   providing a digital output level from the differential amplifier in accordance with a difference between the reference voltage on the first input of the differential amplifier, and the sense voltage on the first input of the differential amplifier;

wherein the reference cell current branch activating step precedes the main cell current branch activating step, and wherein the main cell current branch activating step and the boost circuit activating step occur substantially simultaneously.

5. A method of operating a sense amplifier for reading data stored in a selected memory cell of a flash memory array, comprising:
activating a reference cell current branch comprising a reference cell, a first drain bias section coupled to the reference cell, and a first load section coupled to the first drain bias section and to a first input of the differential amplifier, wherein a reference voltage is established across the first load section;
activating a main cell current branch comprising the selected memory cell, a second drain bias section coupled to the selected memory cell, and a second load section coupled to the second drain bias section and to a second input of the differential amplifier, wherein a sense voltage dependent on the data stored in the selected memory cell is established across the second load section;
activating a boost circuit comprising a pull-up section coupled to the second input of the differential amplifier and a pull-down section coupled to the selected memory cell;
applying the reference voltage to a first input of a differential amplifier, and the sense voltage to a second input of the differential amplifier; and
providing a digital output level from the differential amplifier in accordance with a difference between the reference voltage on the first input of the differential amplifier, and the sense voltage on the first input of the differential amplifier;
wherein the boost circuit establishes a predetermined zero sensing time, further comprising deactivating the boost circuit substantially at the predetermined zero sensing time.

6. A sense amplifier for sensing data stored in a selected memory cell of a flash memory array, comprising:
a differential amplifier;
a $V_{CC}$ voltage node;
a $V_{SS}$ voltage node;
a reference cell current branch activation signal node;
a first cell select NMOS transistor;
a second cell select NMOS transistor;
a reference cell floating gate MOSFET transistor;
a first PMOS transistor switch having a source coupled to the $V_{CC}$ voltage node, a gate coupled to the reference cell current branch activation signal node, and a drain;
a first NMOS transistor load having a drain coupled to the drain of the first PMOS switching transistor, a source coupled to a plus input of the differential amplifier, and a gate coupled to the $V_{CC}$ voltage node;
a first NMOS transistor variable conductor having a drain coupled to the source of the first NMOS transistor load, a source coupled to the reference cell floating gate MOSFET transistor through the first and second cell select NMOS transistors, and a gate;
a first NMOS transistor feedback element having a drain coupled to the gate of the first NMOS transistor variable conductor, a source coupled to the $V_{SS}$ voltage node, and a gate coupled to the source of the first NMOS transistor variable conductor;
a second PMOS transistor switch having a source coupled to the $V_{CC}$ voltage node, a gate coupled to the reference cell activation signal node, and a drain;
a first PMOS transistor load having a source coupled to the drain of the first PMOS switching transistor, a drain coupled to the drain of the first NMOS transistor feedback element, and a gate coupled to the drain of the first PMOS transistor load;
a main cell current branch activation signal node;
a third cell select NMOS transistor;
a fourth cell select NMOS transistor;
a main cell floating gate MOSFET transistor selected from an array of floating gate MOSFET transistors by the third and fourth cell select NMOS transistors;
a third PMOS transistor switch having a source coupled to the $V_{CC}$ voltage node, a gate coupled to the main cell current branch activation signal node, and a drain;
a second NMOS transistor load having a drain coupled to the drain of the second PMOS switching transistor, a source coupled to a minus input of the differential amplifier, and a gate coupled to the $V_{CC}$ voltage node;
a second NMOS transistor variable conductor having a drain coupled to the source of the second NMOS transistor load, a source coupled to the main cell floating gate MOSFET transistor through the third and fourth cell select NMOS transistors, and a gate;
a second NMOS transistor feedback element having a drain coupled to the gate of the second NMOS transistor variable conductor, a source coupled to the $V_{SS}$ voltage node, and a gate coupled to the source of the second NMOS transistor variable conductor;
a fourth PMOS transistor switch having a source coupled to the $V_{CC}$ voltage node, a gate coupled to the main cell current branch activation signal node, and a drain;
a second PMOS transistor load having a source coupled to the drain of the second PMOS switching transistor, a drain coupled to the drain of the second NMOS transistor feedback element, and a gate coupled to the drain of the second PMOS transistor load;
a boost circuit activation signal node;
a fifth PMOS transistor switch having a source coupled to the $V_{CC}$ voltage node, a gate coupled to the boost circuit activation signal node, and a drain;
a NMOS pull up transistor having a drain coupled to the drain of the fifth PMOS transistor switch, a source coupled to the source of the second NMOS transistor load, and a gate coupled to the $V_{CC}$ voltage node;
a boost circuit bias voltage node; and
a NMOS pull down transistor having a source coupled to the $V_{SS}$ voltage node, a drain coupled to the source of the second NMOS transistor load, and a gate coupled to the boost circuit bias voltage node.

* * * * *